(12) United States Patent
Ermisch et al.

(10) Patent No.: US 6,346,805 B1
(45) Date of Patent: Feb. 12, 2002

(54) METHOD AND CONFIGURATION FOR CURRENT MEASUREMENT

(75) Inventors: Jochen Ermisch, Radebeul; Uwe Stephan, Freital; Frank Thieme, Dresden; Peter Bauerschmidt, Schwabach, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/291,665

(22) Filed: Apr. 14, 1999

Related U.S. Application Data

(63) Continuation of application No. PCT/DE97/02348, filed on Oct. 14, 1997.

(30) Foreign Application Priority Data

Oct. 14, 1996 (DE) ........................ 196 42 381

(51) Int. Cl.[7] ............................................. G01R 19/00
(52) U.S. Cl. ......................................................... 324/127
(58) Field of Search ................................. 324/115, 127, 324/117 R, 117 H, 96, 129; 307/64

(56) References Cited

U.S. PATENT DOCUMENTS 4,728,887 A    3/1988  Davis ........................ 324/127
4,831,327 A  * 5/1989  Chenier et al. ............. 324/127

FOREIGN PATENT DOCUMENTS

| DE | 2 244 759 | 3/1974 |
| DE | 4424368 A1 | 7/1995 |
| EP | 0288998 A2 | 11/1988 |
| EP | 0510311 A2 | 10/1992 |
| FR | 2727209 | 5/1996 |

* cited by examiner

Primary Examiner—Safet Metjahic
Assistant Examiner—James C Kerveros
(74) Attorney, Agent, or Firm—Herbert L. Lerner; Laurence A. Greenberg; Werner H. Stemer

(57) ABSTRACT

For precise measurement of currents with high dynamic range, especially in gas-insulated voltage switchgear, a first signal of a first low-power measurement transformer and a second signal of a second nonmagnetic measurement transformer, operating, for example, according to the principle of a Rogowski coil or according to the Faraday effect, are compared. Depending on the degree of accuracy, one of the two signals is then selected and further processed. A deviation of the two signals from each other, especially their gradient, is referred to as comparison criterion. In a corresponding configuration, the two measurement transformers of different type are connected to a common processing component for signal processing.

20 Claims, 2 Drawing Sheets

US 6,346,805 B1

METHOD AND CONFIGURATION FOR CURRENT MEASUREMENT

CROSS-REFERENCE TO RELATED APPLICATION

This is a continuation of copending International Application PCT/DE97/02348, filed Oct. 14, 1997, which designated the United States.

BACKGROUND OF THE INVENTION

Field of the Invention

The invention concerns a method for current measurement, especially in gas-insulated voltage switchgear, for example, in a high or medium-voltage unit. It also pertains to a current measurement configuration for execution of the method.

A so-called measurement transformer or measurement sensor is ordinarily used as a current transformer to measure currents in such gas-insulated switchgear, in which a gas referred to as $SF_6$ is generally used as an insulating gas. The measurement transformer essentially includes, as an information sensor, a coil that concentrically surrounds a current conductor of the unit that conducts a primary current. A secondary current flowing in the coil is then referred to as measurement signal, which is processed in a subassembly of an automation system also referred to as process control technique for the switchgear (LSA).

As described in the essay "20 Years of Research in the Field of Nonconventional Transformers", in ELEKTRIE, Berlin 43 (1989) 6, pages 205 to 207, two different transformer principles can be distinguished. In a so-called conventional transformer, the information sensor and a power supply connected to it are coupled on the primary side to the current conductor of the unit and connected together to the actual load on the secondary side. However, the transformer requires large installation volume. On the other hand, in a so-called non-conventional transformer only the information sensor is coupled to the current conductor of the unit on the primary side. An auxiliary power supply is therefore required in the non-conventional transformer, which is capable of producing a power of up to a few kW, at least for a short time, to maintain the desired nominal output currents of the secondary circuit of 5 or 1. A power amplifier having a corresponding parameter, via which the information sensor is connected to the load, is therefore required. An optical solution is particularly suited for this type of transformer, but can only be implemented at a very high cost.

An intermediate solution is therefore often sought, which underlies the ordinary or conventional measurement principle, but at a low-power level. A low-power measurement transformer based on the intermediate solution, however, is particularly complicated to manufacture, especially if a large saturation-free time is required.

It is also known from Published, European Patent Application 0 510 311 A2, corresponding to U.S. Pat. No. 5,272,460, that a current transformer that operates according to the principle of a Rogowski coil can be used for a metal-encapsulated, gas-insulated high-voltage unit. A current measurement configuration according to the principle of the Rogowski coil is also known from Published, Non-Prosecuted German Patent Application DE 44 24 368 A1. To achieve high imaging trueness in the measurement range while using a Rogowski coil, high expenditure, with correspondingly high costs, is required. The reason for this is that the measurement accuracy of the Rogowski coil, on the one hand, is determined by a number of factors, and that special precautions are required, on the other hand, for high reliability and constancy of parameters, owing to the system-related off-line configuration.

SUMMARY OF THE INVENTION

It is accordingly an object of the invention to provide a method and a configuration for current measurement that overcome the above-mentioned disadvantages of the prior art methods and devices of this general type.

With the foregoing and other objects in view there is provided, in accordance with the invention, a method for measuring current, which includes: comparing a first signal generated by a first low-power measurement transformer having a magnetic core and a second signal generated by a second nonmagnetic measurement transformer; selecting and further processing one of the first signal and the second signal in dependence on an imaging accuracy of a measured current; and evaluating a deviation between the first signal and the second signal as comparison criterion.

The underlying task of the invention is therefore to provide a particularly suited method and a particularly suited configuration for precise measurement of currents with high dynamic range.

The task is solved with reference to the method by comparing a first signal of a first low-power measurement transformer with a magnetic core and a second signal of a second nonmagnetic, especially optical, measurement transformer. Depending on the accuracy of imaging of the measured current, one of the two signals is then selected and further processed. A deviation of the two signals emitted by the measurement transformers of different type from each other is evaluated as comparison criterion.

The invention starts from the consideration that accurate measurement of currents with high dynamic range can be achieved at low cost and limited dimensions by using a combined current measurement element. Only a sensor or transformer is to be operated in the actual measurement range, whereas another sensor is used, essentially in the overcurrent range. The imaging trueness or accuracy in the measurement range can be guaranteed by a low-powered measurement transformer, whereas a Rogowski coil or an optical measurement transformer, operating according to the Faraday effect, takes over imaging of high, stationary or displaced currents. Rotation of the plane of polarization of linearly polarized light occurs, according to the Faraday effect in an optically inactive material in the presence of a magnetic field parallel to the direction of light propagation.

The signals recorded separately by the two measurement transformers, i.e., their output voltages, are expediently processed together. The output voltage of the low-power measurement transformer drops in the event of its saturation. The gradient, for example, the first or second derivative, of its output voltage is then greater than the gradient of the output voltage of the measurement transformer operating according to the principle of the Rogowski coil or according to the Faraday effect. The derivative of output voltages, according to time, can therefore be referred to as a gauge of the accuracy of the two signals. The gradient of the output voltages or output signals of the two measurement transformers is therefore expediently considered as criterion for switching the output signal of the low-power measurement transformer to the output signal of the Rogowski coil or the optical measurement transformer. As an alternative or in addition, a check and evaluation of characteristic features of the two output signals can occur by a fuzzy controller and/or a neuronal net, to form a switching criterion and thus to determine the degree of accuracy.

With the foregoing and other objects in view there is provided, in accordance with the invention, a configuration for measuring current, including: a first low-power measurement transformer having a magnetic core and recording a primary current conducted in a conductor traversed by current and converting the primary current into a first secondary current; a second nonmagnetic measurement transformer for recording the primary current conducted in the conductor traversed by the current and converting the primary current into a second secondary current; a processing component; an input component connected to and downstream from the first low-power measurement transformer for converting the first secondary current of the first low-power measurement transformer to a first output signal and feeding the first output signal to the processing component; a series circuit connected to and downstream of the second nonmagnetic measurement transformer and including an integrator component and a signal amplifier for converting the second secondary current of the second nonmagnetic measurement transformer into a second output signal and feeding the second output signal to the processing component; and the processing component switching from processing the first output signal to the second output signal in dependence on a comparison of curve shapes of the first output signal and the second output signal in the processing component if the magnetic core of the first low-power measurement transformer reaches saturation.

The current measurement configuration includes a combined current measurement element with a low-power measurement transformer and a powerless or optical measurement transformer, especially a Rogowski coil. An input subassembly for level adjustment and potential separation is expediently connected after the low-power measurement transformer. The input subassembly expediently includes, as signal amplifier, an operating amplifier, as well as a voltage-limiting component in the form of a bipolar Zener diode as a protective circuit to guarantee electromagnetic compatibility (EMC protection).

On the other hand, a passive preintegrator is expediently connected after the second measurement transformer, i.e., especially the Rogowski coil, to which an amplifier is connected (again via an EMC protection in the form of a bipolar Zener diode). This can also be a buffer amplifier.

Both measurement transformers are connected to a common processing component for signal processing via the subassemblies connected downstream. The processing component or processing subassembly includes one analog/digital converter (A/D converter) each for the signals produced by the measurement transformers. During use of only a single A/D converter for both signals together, a multiplexer is connected upstream. Evaluation and further processing of the signals transmitted by the measurement transformers expediently occurs on the digital side.

The advantages achieved with the invention consist especially of the fact that both high imaging trueness in the measurement range and good transmission behavior in displaced currents in the overcurrent range and thus a high saturation-free time are achieved by using a combined current measurement element with a low-power measurement transformer and with a Rogowski coil. The expenditure and thus the costs are particularly limited during the use of this type of combined current measurement element, in comparison with a conventional measurement transformer with a connected A/D converter. The configuration is also characterized by high reliability and particularly limited incorporation volume in gas-insulated switchgear. Moreover, direct connection to electronic protection devices is possible without problem.

Other features which are considered as characteristic for the invention are set forth in the appended claims.

Although the invention is illustrated and described herein as embodied in a method and a configuration for current measurement, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
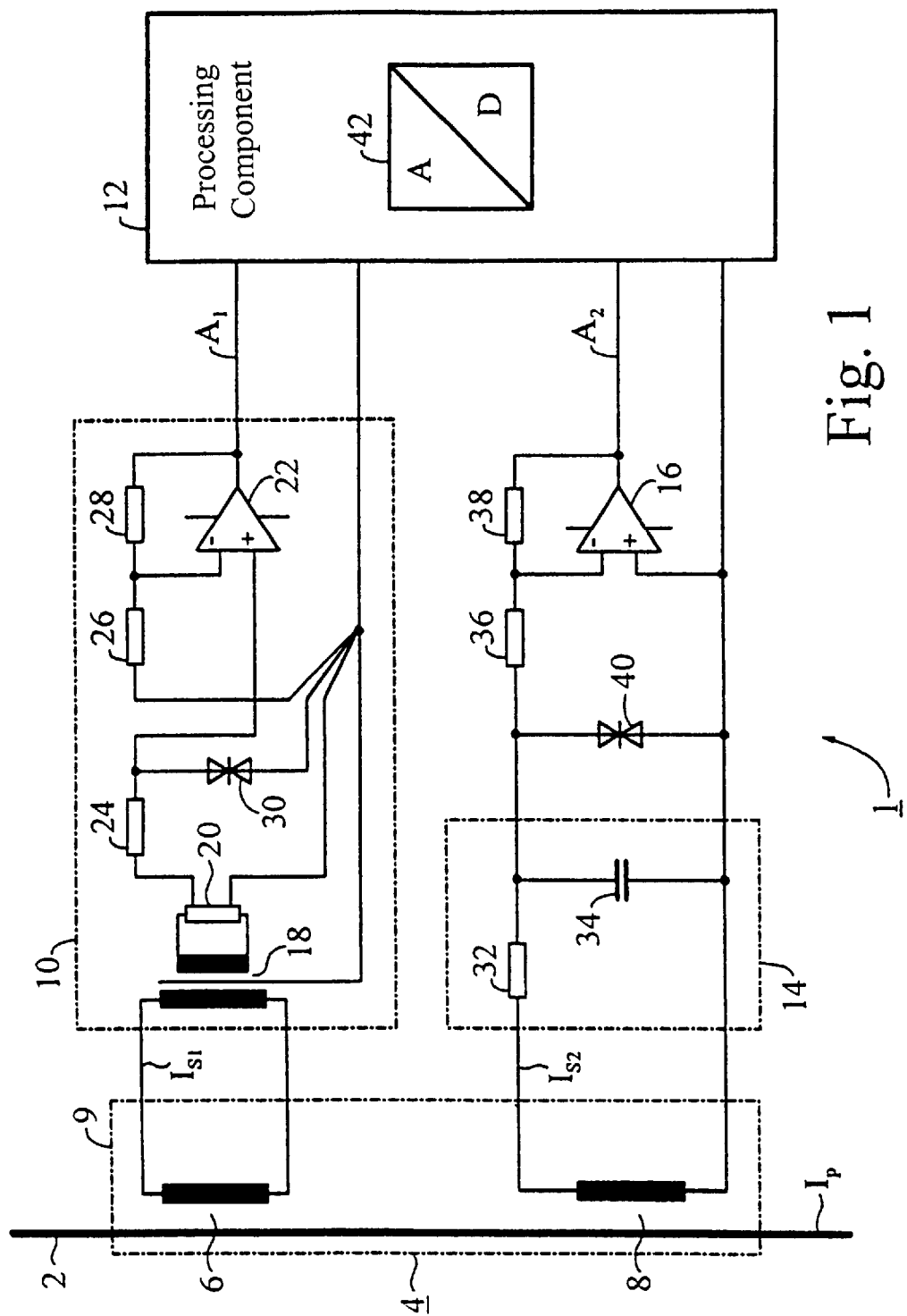
FIG. 1 is a diagrammatic circuit diagram of a current measurement configuration with a low-power measurement transformer and with a Rogowski coil as a nonmagnetic measurement transformer according to the invention.

In all the figures of the drawing, sub-features and integral parts that correspond to one another bear the same reference symbol in each case. Referring now to the figures of the drawing in detail and first, particularly, to FIG. 1 thereof, there is shown a configuration 1 for the precise measurement of currents with high dynamic range. The configuration 1 includes a combined current measurement element with a low-power measurement transformer 6 or wide-range transformer and a Rogowski coil 8 disposed around a conductor 2 traversed by a current of a gas-insulated switchgear 4. The low-power measurement transformer 6 and the Rogowski coil 8 are disposed in a common housing 9. The low-power measurement transformer 6 is connected to a processing component or processing subassembly 12 via an input subassembly or an input component 10. The Rogowski coil 8 is connected to the processing subassembly 12 of a process control technique for the switchgear (LSA) via a series circuit of a passive preintegrator 14 and an operating amplifier 16. An optical measurement transformer, operating according to the Faraday effect, can also be prescribed instead of the Rogowski coil 8.

The input component 10 connected after the low-power measurement transformer 6 includes an adjustment or intermediate transformer 18 with an adjustment resistor or shunt 20 and an operating amplifier 22 with connected resistors 24, 26 and 28, through whose value ratio amplification of the operating amplifier 22 is determined. The input component 10 also includes an EMC protection circuit 30 in the form a bipolar Zener diode.

The passive preintegrator 14 connected after the Rogowski coil 8 includes a resistor 32 and a capacitor 34. The operating amplifier 16, with amplification-determining resistors 36 and 38, is connected on the input side to the passive preintegrator or integrator component 14 and on the output side to the processing component 12 via additional EMC protection 40, again in the form of a bipolar Zener diode. During operation, a primary current $I_P$, fed through the conductor 2 traversed by current, is recorded by both the low-power measurement transformer 6 and by the Rogowski coil 8. The primary current $I_P$ is converted by the low-power measurement transformer 6 to a secondary current $I_{S1}$ and in the Rogowski coil 8 to a secondary current $I_{S2}$. The secondary current $I_{S1}$ is converted in the input component 10, connected after the low-power measurement transformer 6, to a first output signal $A_1$, which is fed to the processing component 12. Similarly, the secondary current $I_{S2}$ of Rogowski coil 8 is converted by the passive preintegrator 14 and operating amplifier 16 into a second output signal $A_2$. The output signals $A_1$ and $A_2$ are initially fed to a processing component 12 to an A/D converter or a multiplexer 42. Processing of signals $A_1$ and $A_2$ then occurs on the digital side.

In a stationary operation, the primary current $I_P$ fed through the conductor 2 traversed by current is recorded by the low-power measurement transformer 6 and processed exclusively in the input component 10 connected downstream, so that only the first output signal $A_1$ is evaluated and further processed in the processing component 12. The output signal $A_2$ of the Rogowski coil 8 is not evaluated in this measurement range.

Figure 2:
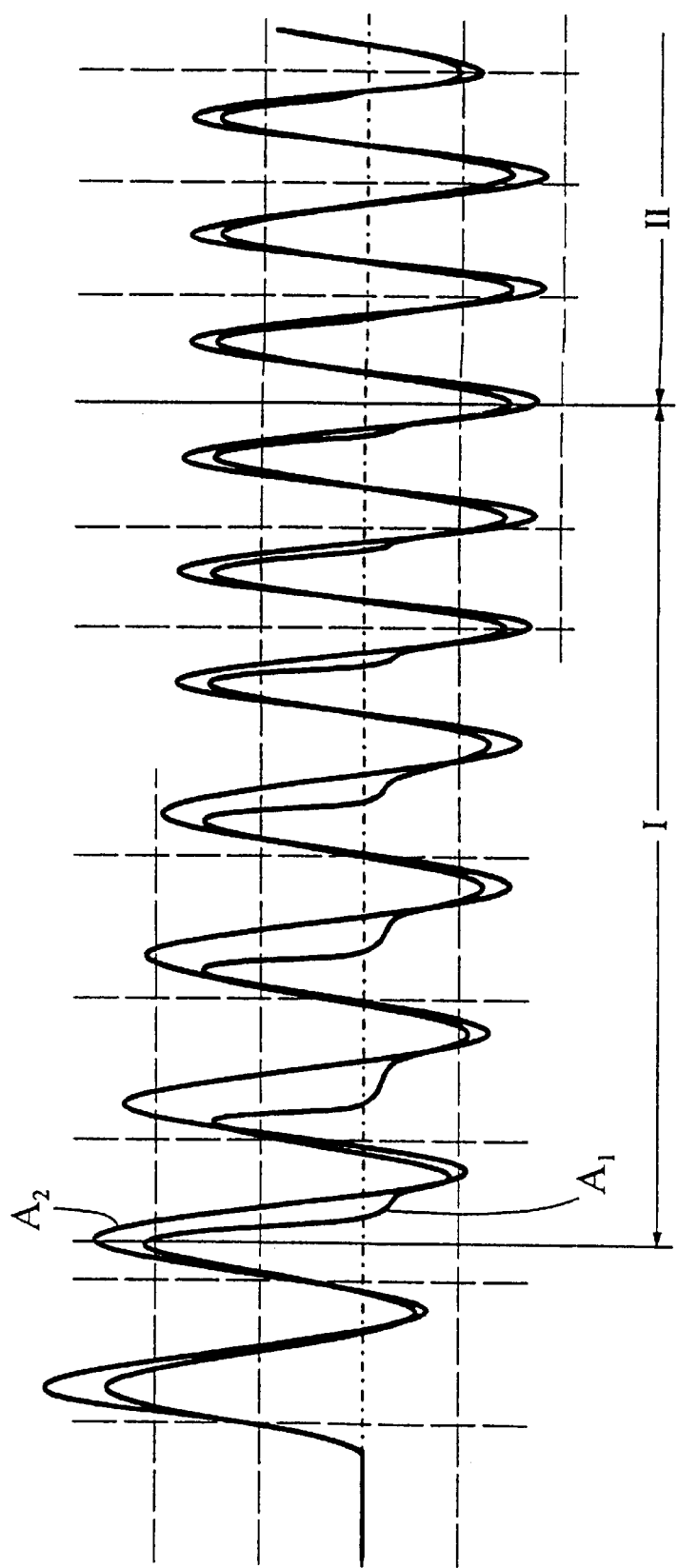
FIG. 2 is a graph of current trends of the two measurement transformers on an output side.

FIG. 2 shows typical amplitude/time trends of the output signals $A_1$, $A_2$ when both measurement transformers 6 and 8 are exposed to a fully displaced primary current $I_P$. Accordingly, the output signal $A_1$ furnished by the low-power measurement transformer 6 can still be used for further processing, even in the stationary overcurrent range (region II), if saturation of the magnetic core of the low-power measurement transformer 6 is not present. In the case of displaced primary currents $I_P$, the magnetic core of the low-power measurement transformer 6 reaches saturation with the corresponding trend of the output signal $A_1$ (region I) The curve shape of the first output signal $A_1$ at the output of the input component 10 will then deviate significantly from the curve form of the second output signal $A_2$, which lies behind the saturation-free Rogowski coil 8 and after preprocessing with the preintegrator component 14 and the operating amplifier 16.

In conjunction with numerical integration of the output signal $A_2$ lying behind the operating amplifier 16, which occurred in the processing component 12, comparison of the curve shapes of the two output signals $A_1$ and $A_2$ occurs in the processing component 12. As a result of this comparison, the curve shapes of the output signal $A_1$ of the low-power measurement transformer 6, on the one hand, and of the output signal $A_2$ of the Rogowski coil 8, on the other, agree relatively well up to onset of saturation of the magnetic core of the low-power measurement transformer 6. The gradient of output voltages of the output signals $A_1$ and $A_2$ is then referred to in particular as comparison criterion. The degree of accuracy of the two output signals $A_1$ and $A_2$ can be derived from this. The reason for this is that the output voltage of the low-power measurement transformer 6, in the case of saturation, drops more strongly than the output voltage of the Rogowski coil 8, so that the gradient of the output signal $A_1$, i.e., initially its first derivative, is larger in the low-power measurement transformer 6 than the gradient of the output signal $A_2$ of the Rogowski coil 8. The deviation of the two output signals $A_1$ and $A_2$ is then used as criterion for switching from output signal $A_1$ of the low-power measurement transformer 6 to the output signal $A_2$ of the Rogowski coil 8.

The low-power measurement transformer 6 thus guarantees high imaging trueness and accuracy in the actual measurement range. The Rogowski coil 8 is therefore not operated as a sensor in the measurement range and in large parts of the protective region. Instead, the only purpose of the Rogowski coil 8 is to image the high, stationary or displaced currents in the overcurrent range. This again guarantees high saturation-free time of the entire configuration.

The accuracy in the measurement range is achievable with the stipulated restrictions with reference to incorporation volume with the low-power measurement transformer 6 in the range of the class accuracies stated in IEC Standard 185, for example, Class 0.2. The reliability of the entire configuration 1 can therefore be evaluated as being significantly higher than the reliability of the Rogowski coil 8 alone. The requirement of keeping the saturation-free time of the low-power measurement transformer 6, at least in the status now achieved, permits reliable measured value recording, at least up to the limits of the low-power measurement transformer 6. With a corresponding protection concept, a sufficient reserve is possible during failure of the evaluation electronics of the Rogowski coil 8 or with a low-power measurement transformer 6.

We claim:

1. A method for measuring current, which comprises:
   comparing a first signal generated by a first low-power measurement transformer having a magnetic core and a second signal generated by a second nonmagnetic measurement transformer; and
   switching from processing the first signal to the second signal in dependence on a comparison of curve shapes of the first signal and the second signal if the comparison shows that the magnetic core of the first low-power measurement transformer reaches saturation.

2. The method according to claim 1, which comprises operating the second nonmagnetic measurement transformer as a measurement transformer operating according to the principle of a Rogowski coil.

3. The method according to claim 1, which comprises operating the second nonmagnetic measurement transformer as an optical measurement transformer operating according to the principle of a Faraday effect.

4. The method according to claim 1, which comprises measuring separately from each other the first signal and the second signal and then processing together the first signal and the second signal.

5. The method according to claim 1, wherein the gradients of the first signal and the second signal, respectively, are used as criterion in the comparison of curve shapes of the first signal and the second signal.

6. The method according to claim 1, which comprises recording the measured current of a gas-insulated voltage switchgear.

7. A configuration for measuring current, comprising:
   a first low-power measurement transformer having a magnetic core and recording a primary current conducted in a conductor traversed by current and converting the primary current into a first secondary current;
   a second nonmagnetic measurement transformer for recording the primary current conducted in the conductor traversed by the current and converting the primary current into a second secondary current;
   a processing component;
   an input component connected to and downstream from said first low-power measurement transformer for converting the first secondary current of said first low-power measurement transformer to a first output signal and feeding the first output signal to said processing component;

a series circuit connected to and downstream of said second nonmagnetic measurement transformer and including an integrator component and a signal amplifier for converting the second secondary current of said second nonmagnetic measurement transformer into a second output signal and feeding the second output signal to said processing component; and said processing component switching from processing the first output signal to the second output signal in dependence on a comparison of curve shapes of the first output signal and the second output signal in said processing component if said magnetic core of said first low-power measurement transformer reaches saturation.

8. The configuration according to claim 7, wherein said second nonmagnetic measurement transformer is a Rogowski coil.

9. The configuration according to claim 7, wherein said second nonmagnetic measurement transformer is an optical measurement transformer operating according to a Faraday principle.

10. The configuration according to claim 7, wherein the primary current is supplied by a gas-insulated voltage switchgear.

11. The configuration according to claim 7, wherein said input component has a matching transformer and a signal amplifier connected to said matching transformer.

12. The configuration according to claim 11, wherein said signal amplifier is an operating amplifier.

13. The configuration according to claim 12, wherein said input component includes a voltage-limiting component disposed between said matching transformer and said signal amplifier.

14. The configuration according to claim 13, wherein said voltage-limiting component is a bipolar Zener diode.

15. The configuration according to claim 7, wherein said integrator component is a passive preintegrator with a resistor and a capacitor connected to said resistor.

16. The configuration according to claim 7, including a voltage-limiting component connected downstream of said second nonmagnetic measurement transformer.

17. The configuration according to claim 16, wherein said voltage-limiting component is a bipolar Zener diode.

18. The configuration according to claim 7, wherein said processing component has at least one A/D converter.

19. The configuration according to claim 18, wherein said processing component has a multiplexer disposed upstream of said at least one A/D converter.

20. The configuration according to claim 7, including a common housing of a gas-insulated switchgear housing said first low-power measurement transformer and said second nonmagnetic measurement transformer.

* * * * *